(12) United States Patent
Bruchhaus et al.

(10) Patent No.: US 6,940,111 B2
(45) Date of Patent: Sep. 6, 2005

(54) RADIATION PROTECTION IN INTEGRATED CIRCUITS

(75) Inventors: Rainer Bruchhaus, Kanagawa (JP); Uwe Wellhausen, Kanagawa (JP); Nicolas Nagel, Kanagawa (JP); Stefan Gernhardt, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/065,922

(22) Filed: Nov. 29, 2002

(65) Prior Publication Data

US 2004/0104754 A1 Jun. 3, 2004

(51) Int. Cl.$^7$ .................. H01L 29/76; H01L 29/94; H01L 31/062; H01L 31/113; H01L 31/119
(52) U.S. Cl. ........................ 257/295; 257/310
(58) Field of Search ................. 257/295, 310, 257/407, 758

(56) References Cited

U.S. PATENT DOCUMENTS

| | | | |
|---|---|---|---|
| 5,315,544 A | * 5/1994 | Yokote et al. | 365/154 |
| 5,399,441 A | 3/1995 | Bearinger et al. | |
| 5,580,814 A | * 12/1996 | Larson | 438/3 |
| 5,638,319 A | * 6/1997 | Onishi et al. | 365/145 |
| 5,711,987 A | 1/1998 | Bearinger et al. | |
| 5,851,870 A | * 12/1998 | Alugbin et al. | 438/239 |
| 5,879,957 A | * 3/1999 | Joo | 438/3 |
| 5,892,254 A | * 4/1999 | Park et al. | 257/295 |
| 5,986,284 A | 11/1999 | Kusaba et al. | |
| 6,080,592 A | * 6/2000 | Paz de Araujo et al. | 438/3 |
| 6,144,060 A | * 11/2000 | Park et al. | 257/310 |
| 6,291,285 B1 | 9/2001 | Wang et al. | |
| 6,376,325 B1 | * 4/2002 | Koo | 438/396 |
| 6,537,830 B1 | * 3/2003 | Arita et al. | 438/3 |
| 6,605,835 B2 | * 8/2003 | Lee | 257/295 |
| 2002/0094595 A1 | 7/2002 | Wada et al. | |
| 2002/0125518 A1 | * 9/2002 | Haneder et al. | 257/295 |
| 2002/0149041 A1 | * 10/2002 | Lee | 257/295 |
| 2002/0153542 A1 | * 10/2002 | Gnadinger | 257/295 |
| 2003/0059462 A1 | * 3/2003 | An | 257/295 |

FOREIGN PATENT DOCUMENTS

| | | | |
|---|---|---|---|
| DE | 198 40 251 A1 | 3/2000 | |
| GB | 2274741 A | * 8/1994 | H01L/29/92 |

* cited by examiner

*Primary Examiner*—Bradley Baumeister
*Assistant Examiner*—Jesse A. Fenty
(74) *Attorney, Agent, or Firm*—Horizon IP Pte Ltd (57) ABSTRACT

Reduced radiation damage to an IC feature is disclosed. At least a portion of the feature which is sensitive to radiation is covered by a radiation protection layer. The radiation protection layer protects the feature from being damaged to radiation during, for example, processing of the IC. In one embodiment, the radiation protection layer comprises a noble metal, oxides, alloys, or compounds thereof.

13 Claims, 8 Drawing Sheets

FIG 1

Prior Art

FIG 2

Prior Art

RADIATION PROTECTION IN INTEGRATED CIRCUITS

BACKGROUND OF INVENTION

During IC fabrication, some processes subject the substrate to UV radiation (e.g., lithography). Exposure to UV radiation has been known to degrade some types of materials used to form the ICs. For example, ferroelectric materials used to form components such as ferroelectric capacitors of ferroelectric memory cells are sensitive to UV radiation.

Figure 1:
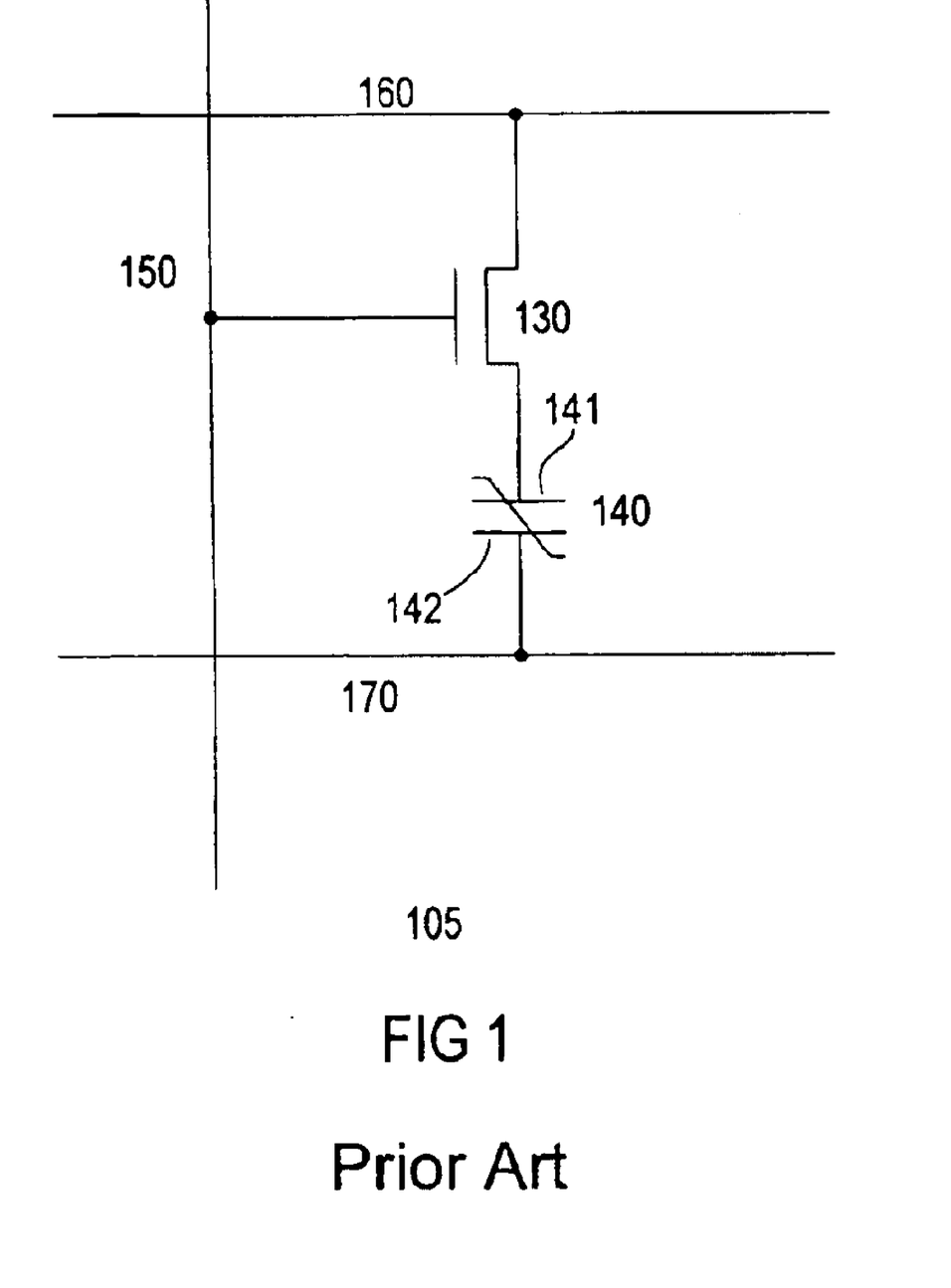
FIG. 1 shows a ferroelectric memory cell.

FIG. 1 shows a conventional ferroelectric memory cell 105 having a transistor 130 and a ferroelectric capacitor 140. The capacitor comprises a ferroelectric ceramic thin film sandwiched between first and second electrodes 141 and 142. Electrode 142 is coupled to a plateline 170 and electrode 141 is coupled to the transistor which selectively couples or decouples the capacitor from a bitline 160, depending on the state (active or inactive) of a wordline 150 coupled to the transistor gate. A plurality of cells are interconnected by platelines, bitlines, and wordlines to form an array.

Figure 2:
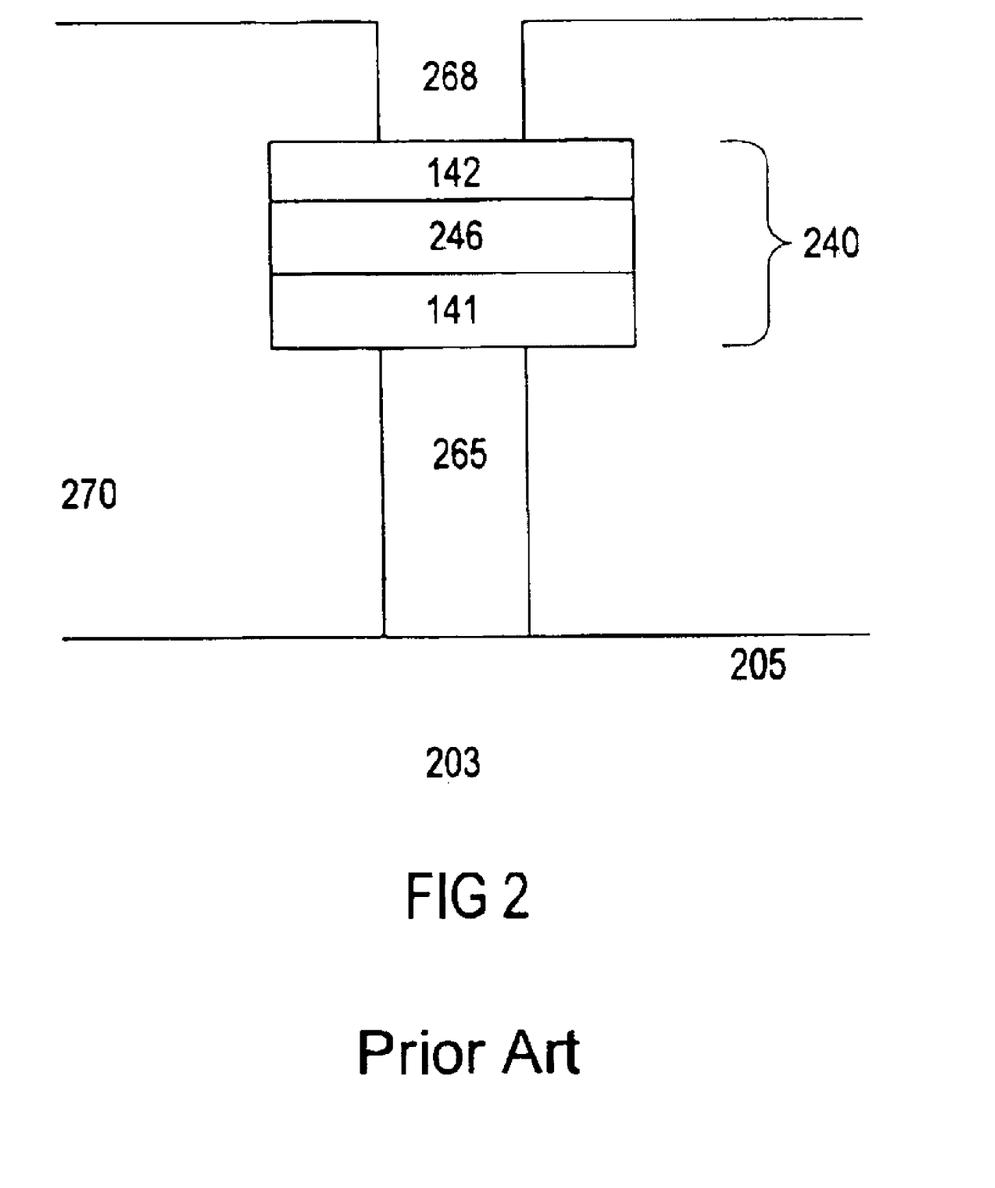
FIG. 2 shows a cross-sectional view of a capacitor on plug structure.

To realize high-density ICs, a capacitor over plug (COP) structure is employed. FIG. 2 shows a conventional ferroelectric COP structure 203. The COP structure is formed on a substrate 205 and insolated by an interlevel dielectric (ILD) layer 270. The COP structure includes a capacitor 240 having a ferroelectric layer 246 located between first and second electrodes 141 and 142. The first electrode is coupled to, for example, a diffusion region of a transistor via a plug 265 while the second electrode is coupled to a plateline via a contact formed in a contact hole 268.

To form the contact hole, a conventional lithographic process is used. Such lithographic process subjects the substrate to UV radiation. As shown, the ferroelectric material on the capacitor sidewalls is exposed, leaving it vulnerable to the UV radiation which can degrade its electrical properties.

From the foregoing discussion, it is desirable to provide a ferroelectric capacitor which avoids or reduces the adverse affects of UV radiation.

SUMMARY OF INVENTION

The invention generally relates to integrated circuits. In one embodiment, a substrate is provided. The substrate includes a feature formed thereon. A radiation protection layer is provided to cover at least the portion of the feature which is sensitive to radiation. In one embodiment, the radiation protection layer protects the feature from being damaged by radiation.

In one embodiment, the feature comprises a ferroelectric capacitor having a ferroelectric layer between top and bottom electrodes. The radiation protection layer covers the sidewalls of the capacitor, reducing radiation damage to the ferroelectric layer. In one embodiment, the radiation protection layer comprises a noble metal, oxides, alloys or compounds thereof. For conductive radiation protection layers, an insulating layer can be provided between the radiation protection layer and feature to prevent shorting of the feature.

DETAILED DESCRIPTION

The invention relates to protecting semiconductor features on a substrate which are sensitive to radiation, such as UV radiation. In one embodiment, the feature comprises a capacitor. Preferably, the feature comprises a ferroelectric capacitor used to form ferroelectric memory cells. Other types of features, such as transistors, which include materials that are sensitive to radiation are also useful.

Figure 3:
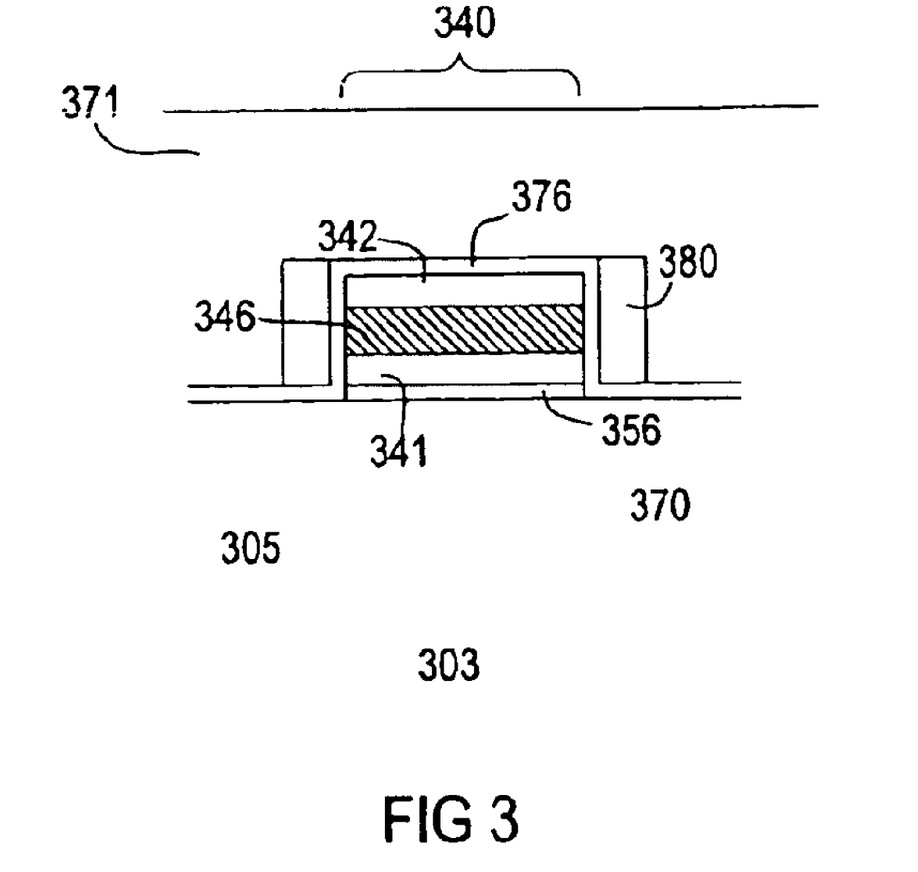
FIGS. 3–4 show embodiments of the invention.

FIG. 3 shows a feature 303 in accordance with one embodiment of the invention. The feature comprises a capacitor 340 formed on a substrate 305. The substrate, for example, comprises silicon. Other types of semiconductor substrates can also be used. The substrate can be, for example, prepared with a dielectric layer 370, such as silicon dioxide. Other types of dielectric material including silicon nitride or silicate glass, are also useful. A plug (not shown), for example, can be located in the dielectric layer to couple the capacitor to a diffusion region of a transistor, forming a memory cell. The plug is formed from a conductive material such as polysilicon or tungsten. Other types of conductive materials are also useful. A plurality of memory cells are interconnected by wordlines and bitlines to form a memory array.

In one embodiment, the capacitor comprises a ferroelectric capacitor. The capacitor comprises top and bottom electrodes 342 and 341 separated by a ferroelectric layer 346. The ferroelectric layer, in one embodiment, comprises PZT. Strontium bismuth tantalum oxide (SBT) or other types of ferroelectric material can also be used. Conductive materials, such as noble metals (e.g., platinum), can be used to form the electrodes. Other types of conductive materials, such as conductive oxides (e.g., $SrRuO_3$ (SRO) or iridium oxide), can also be used to form the electrodes. Alternatively, the electrode can comprise a combination of conductive materials (e.g., noble metal and conductive oxide). It is not necessary that the first and second electrodes be formed from the same type of material.

A barrier layer 356, in one embodiment, is provided between the plug and bottom electrode. The barrier layer inhibits the diffusion of oxygen which can oxidize the plug. Materials such as iridium can be used to form the barrier layer. Other types of barrier materials which inhibit diffusion of oxygen are also useful. An adhesion layer comprising, for example titanium nitride or titanium, can be provided between the barrier and dielectric layer to promote adhesion.

In accordance with the one embodiment of the invention, a radiation protection layer 380 is provided to cover at least the exposed portions of the ferroelectric layer of the capacitor. In a preferred embodiment, the radiation protection layer comprises sidewall spacers to cover the sidewalls of the capacitor. Providing the radiation layer which covers the top and sidewalls of the capacitor can also be useful. The radiation protection layer comprises a material which can block or absorb radiation, such as UV radiation. In one embodiment, the radiation protection comprises a noble metal, such as Pt, Ir, Ru, or Rh. Other materials, including oxides, alloys or compounds of noble metals, are also useful. Alternatively, other stable oxides or materials which can serve as a barrier to UV radiation are also useful. The thickness of the radiation protection layer is sufficient to prevent the penetration of UV radiation to the ferroelectric layer. In one embodiment, the radiation protection layer is about 20 nm thick. Other thicknesses can also be useful, depending on the material and application.

For conductive radiation protective materials, an insulating layer is provided to prevent shorting of materials of the feature. For example, an insulating layer can be provided between the capacitor and conductive radiation protective material to prevent shorting of the electrodes of the capacitor.

In one embodiment, an encapsulation layer 376 is provided over the capacitor. The encapsulation layer, in one embodiment, comprises aluminum oxide ($Al_2O_3$). Other types of non-conductive barrier materials can also be used. A lower barrier layer can be provided between the gate and capacitor to protect, for example, the gate stack and contact from being oxidized during high temperature processes, such as an oxygen recovery anneal. The encapsulation layer can advantageously serve as the insulating layer. A dielectric layer 371 can be provided over the capacitor to provide insulation from, for example, a metal layer above. In one embodiment, the dielectric layer comprises oxide. Other types of dielectric material including silicon nitride or silicate glass, are also useful.

Figure 4:
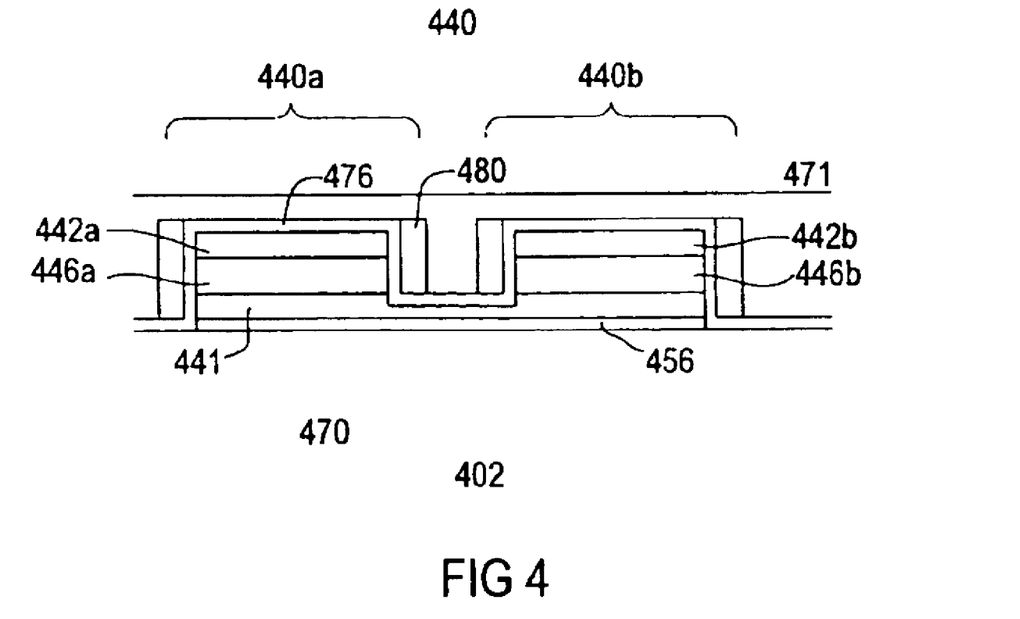

FIG. 4 shows an alternative embodiment of the invention. As shown, the feature 402 comprises a capacitor pair 440, such as those employed in series memory architectures. Series memory architectures are described in, for example, Takashima et al., "High Density Chain Ferroelectric Random Access Memory (chain FRAM)", IEEE Jrnl. of Solid State Circuits, vol.33, pp.787–792, May 1998, which is herein incorporated by reference for all purposes. In a series architecture, memory cells of a group, each with a capacitor coupled in parallel to a transistor, are coupled in series. The memory cells of a group are arranged into pairs.

The capacitor pair comprises first and second capacitors 440a–b. The capacitors, in one embodiment, are ferroelectric capacitors. The capacitors, each comprises top 442 and bottom 441 electrodes separated by a ferroelectric layer 446. In one embodiment, the bottom electrodes of the capacitors of the capacitor pair is a common bottom electrode. To ensure that the ferroelectric layers of the capacitors are separated, an overetch can be performed. The overetch removes some bottom electrode material between the capacitors.

The common electrode of the capacitor pair, for example, is coupled to a common diffusion region of two adjacent memory cell transistors by a plug. A barrier layer 456 can be provided between the plug and bottom electrode. The barrier layer inhibits the diffusion of oxygen which can oxidize the plug. Materials such as iridium can be used to form the barrier layer. Other types of barrier materials which inhibit diffusion of oxygen are also useful. An adhesion layer comprising, for example titanium nitride or titanium, can be provided between the barrier and dielectric layer to promote adhesion. The top electrode is coupled to the bottom electrode of an adjacent capacitor pair and a common diffusion region with a transistor of an adjacent memory cell pair.

In accordance with the one embodiment of the invention, radiation protection spacers 480 are formed on the sides of the capacitors. Alternatively, the radiation protection layer covers at least the ferroelectric layers. Providing a radiation layer which covers the capacitors is also useful. Various types of materials which prevent the penetration of or absorb radiation can be used to form the radiation protection layer. In one embodiment, the radiation protection comprises a noble metal, such as Pt, Ir, Ru, or Rh. Other materials, including oxides, alloys, or compounds of noble metals, are also useful.

Alternatively, other stable oxides or materials which can serve as a barrier to UV radiation are also useful. The thickness of the radiation layer is sufficient to prevent the penetration of UV radiation to the ferroelectric layer. In one embodiment, the radiation protection layer is about 20 nm thick. Other thicknesses can also be useful, depending the material and application.

For conductive radiation protective materials, an insulating layer can be provided to prevent shorting of materials of the feature. For example, an insulating layer can be provided between the capacitor and conductive radiation protective material to prevent shorting of the electrodes of the capacitor.

In one embodiment, an encapsulation layer 476 is provided over the capacitor. The encapsulation layer, in one embodiment, comprises aluminum oxide ($Al_2O_3$) Other types of non-conductive barrier materials can also be used. A lower barrier layer can be provided between the transistor and capacitor to protect, for example, the gate stack and contact from oxidizing during high temperature processes, such as an oxygen recovery anneal. The encapsulation layer can advantageously serve as the insulating layer. A dielectric layer 471 can be provided over the capacitor to provide insulation from, for example, a metal layer above. In one embodiment, the dielectric layer comprises oxide. Other types of dielectric material including silicon nitride or silicate glass, are also useful.

FIGS. 5–8 show a process form forming a feature 502 protected by a radiation protection layer in accordance with one embodiment of the invention. As shown, the feature is formed on a substrate. The feature can comprise a circuit feature which is or includes material sensitive to UV radiation. Typically, the substrate comprises silicon. Other types of semiconductor substrates are also useful. Alternatively, the feature can be used to form, for example, electromechanical or other types of devices. For such applications, the substrate can comprise various types of materials which can support the feature. For example, the substrate can be formed from glass or other types of materials, depending on the application.

Figure 5:
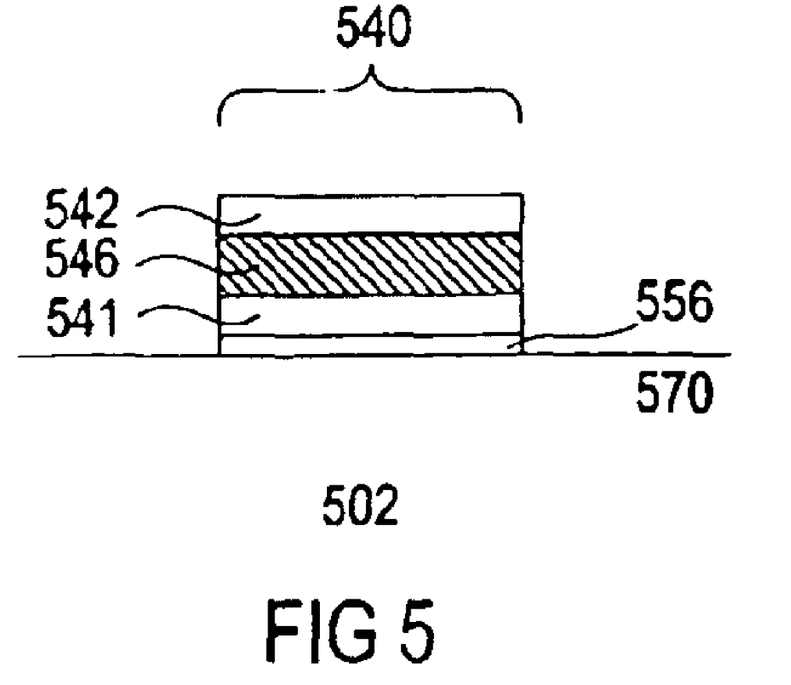
FIGS. 5–8 show a process for fabricating a capacitor in accordance with one embodiment of the invention.

In one embodiment, the feature comprises a capacitor 540. Preferably, the capacitor comprises a ferroelectric capacitor having a ferroelectric layer 546 between top 542 and bottom 541 electrodes. The substrate, in one embodiment, comprises silicon or other types of semiconductor material. The substrate can be prepared with, for example, a dielectric layer 570. The dielectric layer serves as an interlevel dielectric which covers other circuit features, such as transistors formed on the substrate below. In one embodiment, the dielectric layer comprises oxide. Other types of dielectric material including silicon nitride or silicate glass, are also useful.

In one embodiment, a plug is provided in the dielectric layer, coupling the bottom electrode to a diffusion region of a transistor. The capacitor and transistor form a memory cell. Although only one capacitor is shown, it is understood that a plurality of capacitors can be provided to form a memory array. Alternatively, the capacitors can be arranged as capacitor pairs, such as those described in FIG. 4.

A barrier layer 556, in one embodiment, is provided between the plug and bottom electrode. The barrier layer inhibits the diffusion of oxygen which can oxidize the plug. Materials such as iridium can be used to form the barrier layer. Other types of barrier materials which inhibit diffusion of oxygen are also useful. An adhesion layer comprising, for example titanium nitride or titanium, can be provided between the barrier and dielectric layer to promote adhesion.

In one embodiment, the capacitor can be formed using conventional techniques. Such techniques include, for example, depositing the various layers of the capacitor on the substrate and patterning them together using mask and etch processes. Alternatively, the capacitor layers can be patterned in multiple processes. For example, ferroelectric layer and top electrode can be patterned first, followed by patterning of the bottom electrode. Such two step processes are useful for forming capacitor pairs. Also, the bottom electrode layer can be deposited and patterned followed by the deposition and patterning of the other layers of the capacitor.

Figure 6:
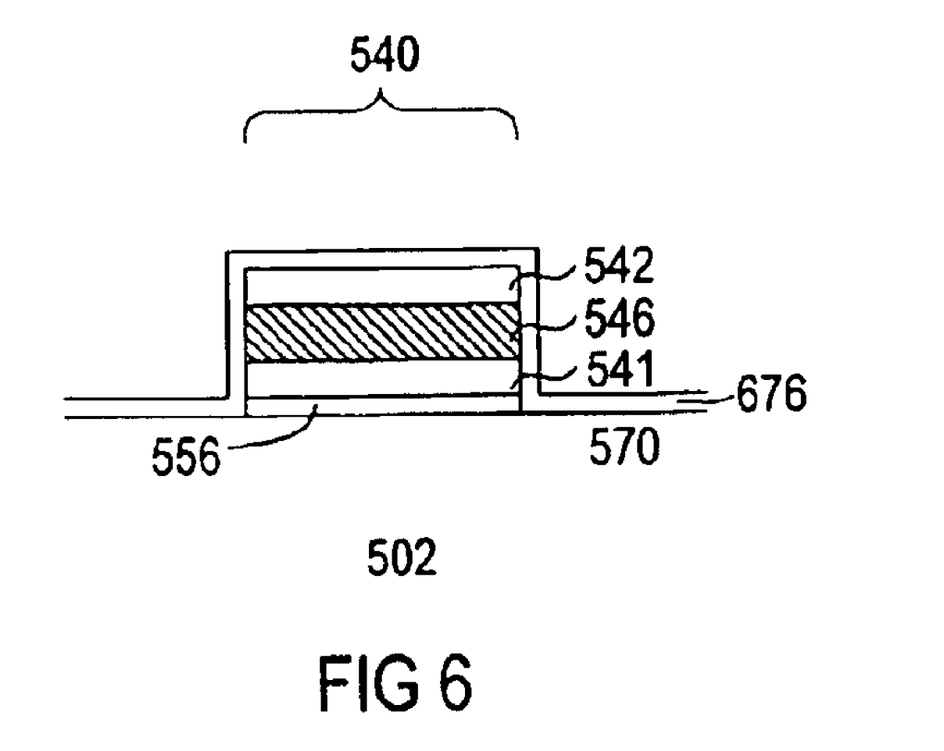

Referring to FIG. 6, an encapsulation layer 676 is formed on the substrate, covering the capacitor. The encapsulation layer prevents diffusion of oxygen to the capacitor. Preferably, the encapsulation layer comprises an insulating material. In one embodiment, the encapsulation layer comprises aluminum oxide ($Al_2O_3$). Other types of barrier materials are also useful. The encapsulation layer is formed by conventional techniques. Such techniques include, for example, sputtering or atomic layer deposition.

Figure 7:
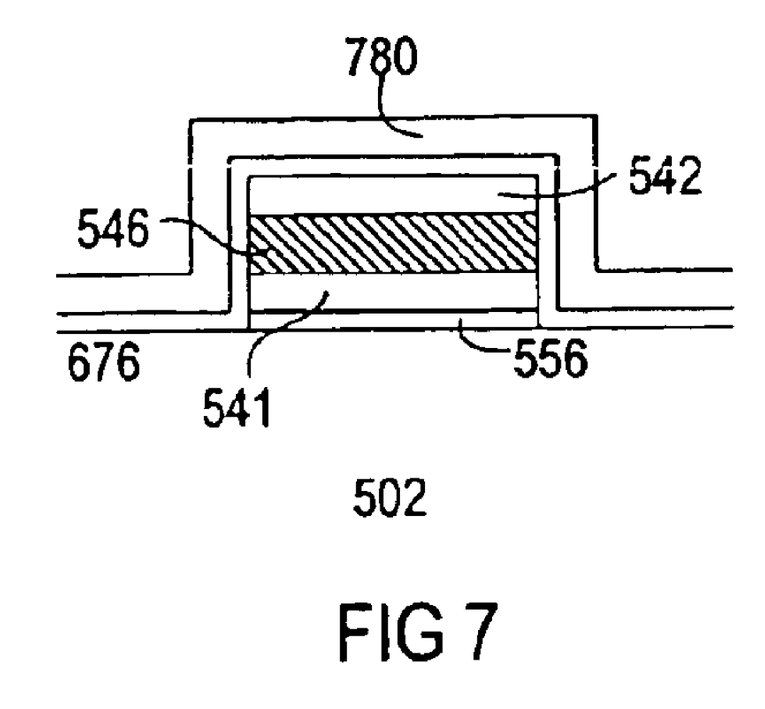

In FIG. 7, a radiation protection layer 780 is deposited on the substrate. The radiation protection layer covers the capacitor and substrate. In one embodiment, the radiation protection layer comprises, a noble metal such as Pt, Ir, Ru, Rh. Other thermally stable oxide conductors such as $IrO_2$, $RuO_2$ or materials which can block UV radiation can also be used. In one embodiment, the radiation protection layer comprises Pt. The thickness of the radiation protection layer should be sufficiently thick to prevent the penetration of UV radiation. The radiation protection layer, for example, is about 20 nm thick. Other thicknesses may also be useful. Various techniques, such as sputtering or chemical vapor deposition (CVD), can be used to form the radiation protective layer.

Figure 8:
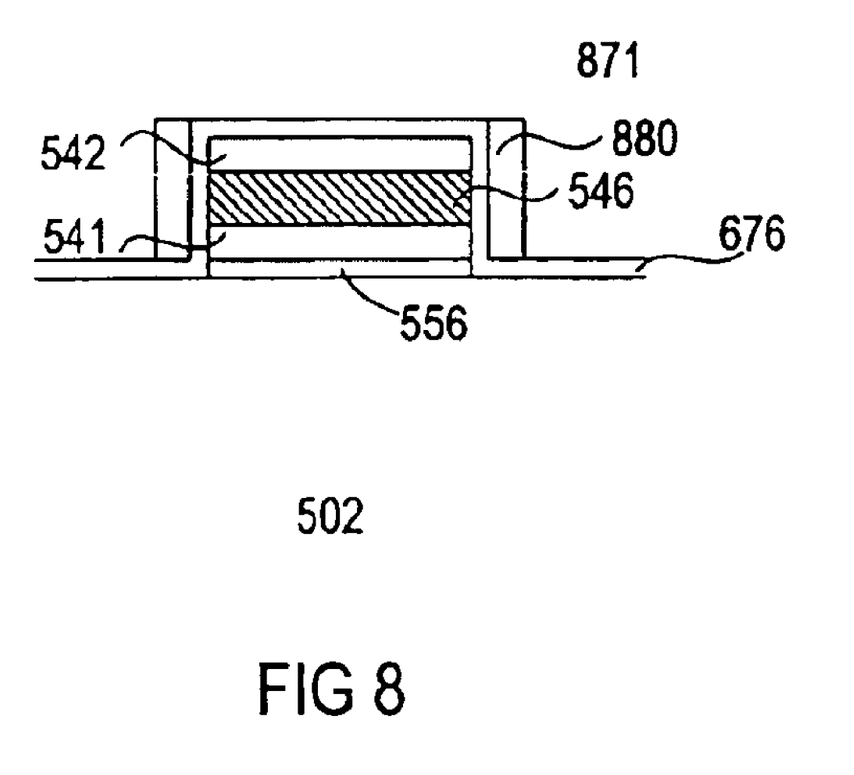

Referring to FIG. 8, an anisotropic etch is performed. The anisotropic etch, for example, comprises a reactive ion etch (RIE). Other etch techniques are also useful. The etch, in one embodiment, is selective to the encapsulation layer. The etch removes the horizontal parts of the radiation protection layer, forming spacers 880 on the sidewalls of the capacitor.

After the spacers are formed, a dielectric layer 871 is deposited on the substrate, serving as an interlevel dielectric to isolate the capacitor from a metal layer above. The process continues to complete the fabrication process. For example, the process continues to complete forming the memory cells, such as interconnections, passivation, and packaging.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
   a substrate;
   a feature formed on the substrate;
   an insulating layer formed on the feature; and
   a radiation protection layer comprising a conductive material covering at least all portions of the feature which are sensitive to radiation, the radiation protection layer is electrically isolated from the feature by the insulating layer, the radiation protection layer reduces radiation damage to the portions of the feature sensitive to radiation.

2. The integrated circuit of claim 1 wherein the feature comprises a ferroelectric capacitor having top and bottom electrodes separated by a ferroelectric layer, the ferroelectric layer being sensitive to radiation.

3. The integrated circuit of claim 2 wherein the radiation protection layer is located on sidewalls of the capacitor to form spacers to reduce radiation damage to the ferroelectric layer as a result of portions of the ferroelectric layer which are unprotected by the top electrode.

4. The integrated circuit of claim 2 further comprises a plurality of features to form a memory array.

5. The integrated circuit of claim 4 wherein the radiation protection layer comprises sidewall spacers located on sidewalls of the capacitor to reduce radiation damage to the ferroelectric layer as a result of portions of the ferroelectric layer which are unprotected by the top electrode.

6. The integrated circuit of any of claims 1–5 wherein the material of the radiation protection layer absorbs or serves as a barrier to UV radiation.

7. The integrated circuit of claim 6 wherein the insulating layer serves as a barrier to hydrogen.

8. The integrated circuit of claim 7 wherein the material of the radiation protection layer comprises a noble metal, oxides, or compounds thereof.

9. The integrated circuit of claim 6 wherein the material of the radiation protection layer comprises a noble metal, oxides, or compounds thereof.

10. A method of fabricating an integrated circuit comprising:
    providing a substrate with a feature formed on the substrate;
    providing an insulating layer over the feature; and
    forming a radiation protection layer comprising a conductive material to cover at least all portions of the feature which are sensitive to radiation, the insulating layer electrically isolating the conductive radiation layer from the feature, the radiation protection layer sufficiently thick to reduce radiation damage to the portions of the feature sensitive to radiation.

11. The method of claim 10 wherein the feature comprises a ferroelectric capacitor having a ferroelectric layer between top and bottom electrodes, the radiation protection layer reduces radiation damage to the ferroelectric layer as a result of portions of the ferroelectric layer which are unprotected by the top electrode.

12. The method of claim 10 wherein forming the radiation protection layer comprises forming spacers comprising the conductive material of the radiation protection layer on sidewalls of a ferroelectric capacitor to reduce radiation damage to the ferroelectric layer of the capacitor as a result of portions of the ferroelectric layer which are unprotected by the top electrode.

13. The method of claim 10, 11 or 12 wherein the conductive material of the radiation protection layer comprises a noble metal, oxides, or compounds thereof.

* * * * *